US008450849B2

(12) United States Patent
Lu et al.

(10) Patent No.: US 8,450,849 B2
(45) Date of Patent: May 28, 2013

(54) ROBUST FBEOL AND UBM STRUCTURE OF C4 INTERCONNECTS

(75) Inventors: Minhua Lu, Armonk, NY (US); Eric D. Pefecto, Armonk, NY (US); David L. Questad, Armonk, NY (US); Sudipta K. Ray, Armonk, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/478,076

(22) Filed: May 22, 2012

(65) Prior Publication Data

US 2012/0286433 A1 Nov. 15, 2012

Related U.S. Application Data

(63) Continuation of application No. 12/560,769, filed on Sep. 16, 2009, now Pat. No. 8,227,918.

(51) Int. Cl.
*H01L 23/12* (2006.01)
*H01L 21/44* (2006.01)

(52) U.S. Cl.
USPC ............... 257/738; 257/737; 257/E23.021; 257/E23.069; 438/612; 438/613; 438/614; 438/615; 438/617

(58) Field of Classification Search
USPC ............... 257/737, 738, E23.021, E23.069; 438/612–617; 228/180.22
See application file for complete search history.

(56) References Cited

U.S. PATENT DOCUMENTS

| | | | |
|---|---|---|---|
| 4,845,542 A | 7/1989 | Bezuk et al. | |
| 6,104,087 A | 8/2000 | DiStefano et al. | |
| 6,211,572 B1 | 4/2001 | Fjelstad et al. | |
| 6,372,527 B1 | 4/2002 | Khandros et al. | |
| 6,521,970 B1 | 2/2003 | Takiar et al. | |
| 6,528,349 B1 | 3/2003 | Patel et al. | |
| 7,375,021 B2 | 5/2008 | Edelstein et al. | 438/613 |
| 7,439,170 B1 | 10/2008 | Daubenspeck et al. | 438/614 |
| 7,456,046 B2 | 11/2008 | Buchwalter et al. | 438/107 |
| 7,737,439 B2 | 6/2010 | Mardi et al. | 257/48 |
| 7,947,978 B2 | 5/2011 | Lin et al. | 257/48 |
| 8,227,918 B2 * | 7/2012 | Lu et al. | 257/738 |
| 2008/0029889 A1 | 2/2008 | Buchwalter et al. | 257/737 |
| 2008/0277765 A1 | 11/2008 | Lane et al. | |

OTHER PUBLICATIONS

Kasim, R., et al., "Reliability for Manufacturing on 45 nm Logic Technology...," ICEE CFPO9RPS-CDR47th International Reliability Physics Symposium, Montreal, 2009, pp. 350-354.

* cited by examiner

*Primary Examiner* — Jasmine Clark
(74) *Attorney, Agent, or Firm* — Robert J. Eichelburg (57) ABSTRACT

An electrical conductor is connected to a first microcircuit element having a first connector site axis and a second microcircuit having a second connector site axis. The first microcircuit and the second microcircuit are separated by and operatively associated with a first electrical insulator layer. The conductor and the first microcircuit element are separated by and operatively associated with a second electrical insulator layer. At least one of the first electrical insulator layer and the second electrical insulator layer comprise a polymeric material. The microcircuit includes a UBM and solder connection to a FBEOL via opening. Sufficiently separating the first connector site axis and the second connector site axis so they are not concentric, decouples the UBM and solder connection to the FBEOL via opening. This eliminates or minimizes electromigration and the white bump problems. A process comprises manufacturing the microcircuit.

24 Claims, 6 Drawing Sheets

ROBUST FBEOL AND UBM STRUCTURE OF C4 INTERCONNECTS

RELATED APPLICATIONS

The present application is a continuation application of U.S. patent application Ser. No. 12/560,769, filed Sep. 16, 2009, now U.S. Pat. No. 8,227,918 which is incorporated herein by reference in its entirety.

FIELD OF THE INVENTION

The field of the invention comprises C4 interconnects, and both robust far back end of the line ("FBEOL") and ball limiting metallurgy also known as under board metallization, or under mask metallization, or under mask-bump metallurgy ("UBM") structures as part of these interconnects. "C4" comprises the term for describing the method of connecting semiconductor and other devices, also known as the IBM "flip chip" or "controlled collapse chip connection," from which the industry derives the acronym "C4." The devices that employ C4 technology comprise integrated circuits ("IC" chips) and microelectromechanical systems ("MEMS") both of which are well known in the art.

C4 is a method for interconnecting these devices to external circuitry by means of solder bumps that have been deposited on semiconductor chip pads. In order to mount the chip to external circuits such as a circuit board or another chip or a wafer used in manufacturing other chips, a chip having solder bumps is flipped over so that the solder is aligned with matching connecting sites (e.g., connector pads) on an external circuit, and the connection completed by raising the temperature of the solder so that it flows and adheres to the connecting sites.

BACKGROUND OF THE INVENTION

Flip chip technology is the fastest growing chip interconnect technology as it allows the largest numbers of inputs/outputs ("I/Os") for the smallest footprint of the chip. This enables the manufacture of small packages such as packages comprising chip-scale packages.

The use of flip chip bump technology also extends to passive filters, detector arrays and MEMS devices. IBM introduced this technology in the early 1960's with the solid logic technology in the IBM System/360™. It extended interconnection capabilities beyond existing wire-bonding techniques, allowing the area array solder-bump configuration to extend over the entire surface of the chip (die) providing solder bumps for interconnection to a substrate by the C4. This allowed for the highest possible I/O counts to meet the increasing demand for electrical functionality and reliability in IC technology.

The original wafer-bumping process of metal mask evaporation (UBM) involve the evaporation onto a wafer surface of solder through mask openings in an area array fashion. The need for increased I/O density and count, and pressures to lower the cost of flip-chip interconnections have spurred the development of other wafer bumping techniques such as electroplating or stencil-printing/paste-screening (solder paste) bump processes. Some of the more newly developed bumping processes include transfer printing, solder jetting, and bumpless and conductive particle applications.

In its broader aspect UBM comprises the application of a metal coating to the die contact pads such as aluminum or copper contact pads, where the metal coating provides a surface that can adhere to solder. The UBM typically consist of an adhesion layer, such as Ti or TiW and a barrier layer, such as Ni, to which the solder gets attached.

The overview of flip chip technology shows its major advantage lies in utilizing the total chip area to make the I/O connections, whereas wire bonding uses only the chip periphery. A disadvantage of flip chip technology is that stresses that arise from the thermal mismatch between the silicon (chip) thermal expansion coefficient ("CTE") and the CTE of the substrate are borne fully by the solder bumps ("C4s") used to make the interconnect between chip and substrate.

The so-called "solder bumps" provide a space between the chip and the substrate, usually filled in the last steps of the assembly process with a nonconductive "underfill" material that adhesively joins the entire surface of the chip or die to the substrate. The underfill not only blocks contaminants from entering into the structure but also locks the chip or die to the organic substrate so that differences in thermal expansion do not break or damage the electrical connections of the bumps Government regulations and customer needs have also impacted flip-chip interconnection technology requiring manufacturers to make a major transition from Pb/Sn to Pb-free solders and to produce larger wafers. Two main interconnection problems have surfaced during the transition of leaded to Pb-free solders; electromigration ("EM") and chip package interactions ("CPI"). The principal CPI problem comprises semiconductor dielectric cracks due to the high stresses, known as white bump, which resulted when the industry changed over to the use of harder lead-free solders. Presently, the solution to the problems of these two technologies (EM and CPI) are counter to each other, i.e., solder additives and grain orientation which enhance EM performance tend to harden the solder even more, resulting in increased CPI stresses and white bumps. Additionally, the current FBEOL structure tends to localize the current flow by not allowing a good thick conductive metal to distribute the current around via openings in the circuit produced lithographically, such as by the use of photo sensitive polyimides ("PSPI").

RELATED ART

L. P. Buchwalter, et al. describes various methods and structures for creating flexible connections in integrated circuits in United States Patent Publication 2008/0029889 and U.S. Pat. No. 7,456,046. Daubenspeck, et al. U.S. Pat. No. 7,439,170 discloses designs for chip stress reduction, and Edelstein, et al. U.S. Pat. No. 7,375,021 describe methods for FBEOL semiconductor device formation.

Other United States Patents describe chip carrier connections that compensate for stresses and other interconnection and structural problems that can occur in the manufacture of these devices and comprise Patel, et al. U.S. Pat. No. 6,528,349; Takiar et al., U.S. Pat. No. 6,521,970; Khandros, et al., U.S. Pat. No. 6,372,527; Fjelstad, et al. U.S. Pat. No. 6,211,572; DiStefano, et al., U.S. Pat. No. 6,104,087; and Bezuk, et al., U.S. Pat. No. 4,845,542.

SUMMARY OF THE INVENTION

To achieve these and other advantages, and in accordance with the purpose of the invention as embodied and broadly described herein, the invention comprises an article of manufacture and a process for the elimination of high CPI stresses by eliminating the concentric nature of the current design (Al pad opening concentric with UBM), and separating the conductive path of the FBEOL and the location of the UBM. The separation of these two structures now enables several new structure possibilities and performance enhancement, e.g., elimination of terminal metal (TD) aluminum, integration of UBM within the new pad structure, increase of conductive metal thickness for better current distribution and EM performance, and a reduction of current density by a factor of greater than one to about a factor of greater than about five or higher. An additional improvement obtained by eliminating the concentric nature of the current design comprises the placement of solder and UBM directly on a thick PSPI or equivalent, which acts as a cushion layer to the rest of the semiconductor structures. In one embodiment, the design for a 200 um (micron) solder pitch (or minimum distance of adjacent C4s) will increase EM life by obtaining larger current density. Typical vias in the PSPI or equivalent in the present structure comprising this 200 um solder pitch is ~40 um diameter; it will be replaced by a ~90 um diameter via opening and thereby reducing the current density. These structure changes in turn allow for an increase of solder stresses which in turn enable the use of a wider range of joining materials and deposition methods.

BRIEF DESCRIPTION OF THE DRAWINGS

The accompanying Figures, together with the detailed description herein serve to further illustrate various embodiments and to explain various principles and advantages of the present invention.

DETAILED DESCRIPTION OF THE INVENTION

In one embodiment, this invention replaces the traditional FBEOL structure with an organic dielectric structure, i.e., a polymeric insulator. In another embodiment this invention replaces the traditional FBEOL structure with a two level organic dielectric structure, i.e., a polymeric insulator. The organic dielectric comprises polymers such as PSPI, or BCB (benzocyclobutene based polymers); epoxy polyimide, polynorbornene, polytetrafluoroethylene (PTFE); and polyvinylidene fluoride/trifluoroethylene copolymers; as well as silicone dielectric polymers such as hydrogen silsesquioxane (HSQ), methylsilsesquioxane (MSQ), SiLK™ (Dow Chemical Co.) and epoxysiloxane polymers; polyphenylene; polynaphthalene; and poly-4-vinylphenol as compounds, compositions of matter or as films; any of which may contain a photosensitive material; the polymers including combinations of the organic dielectrics; such as combinations of two; three; or four organic dielectrics either as a mixture of polymers for forming a film or as combinations of different films of individual polymers for use in the article of manufacture of the invention.

In the Figures, PSPI is used to represent the organic dielectric, but any organic dielectric such as the organic dielectrics outlined above and the art-known equivalents thereof can be used in the article of manufacture or the method of the invention described herein, or the article of manufacture illustrated in the Figures, By decoupling the UBM and solder connection to the FBEOL via structure, we are able to decouple the electromigration and the white bump problems, allowing for independent solutions for each, and adding process robustness with a design for manufacturability. FIG. 2 demonstrates an embodiment of this new structure. As an example of the advantages of the present invention, we achieve a reduction of current density by a factor of five from the baseline device illustrated in FIG. 1. One key element comprises a reduction in the first PSPI opening in PSPI #1 to about 10 um. This allows for increased wiring channels in the last BEOL wiring level. Then, the subsequent Cu connection can be fabricated by subtractive etching or pattern electroplating. If pattern electroplating is used, the Ni UBM can also be integrated. Alternatively, the Ni UBM can be deposited selectively only in the opening of PSPI #2 (element 211 in FIG. 2) by using an electroless process. The UBM in FIG. 3 can be fabricated independently of the solder deposition process, allowing for a low cost Ni, NiTi, NiSi and combinations thereof or equivalent UBMs and combinations thereof, and the solder (Pb or Pb-free) can be deposited using the lowest cost processes.

Figure 4:
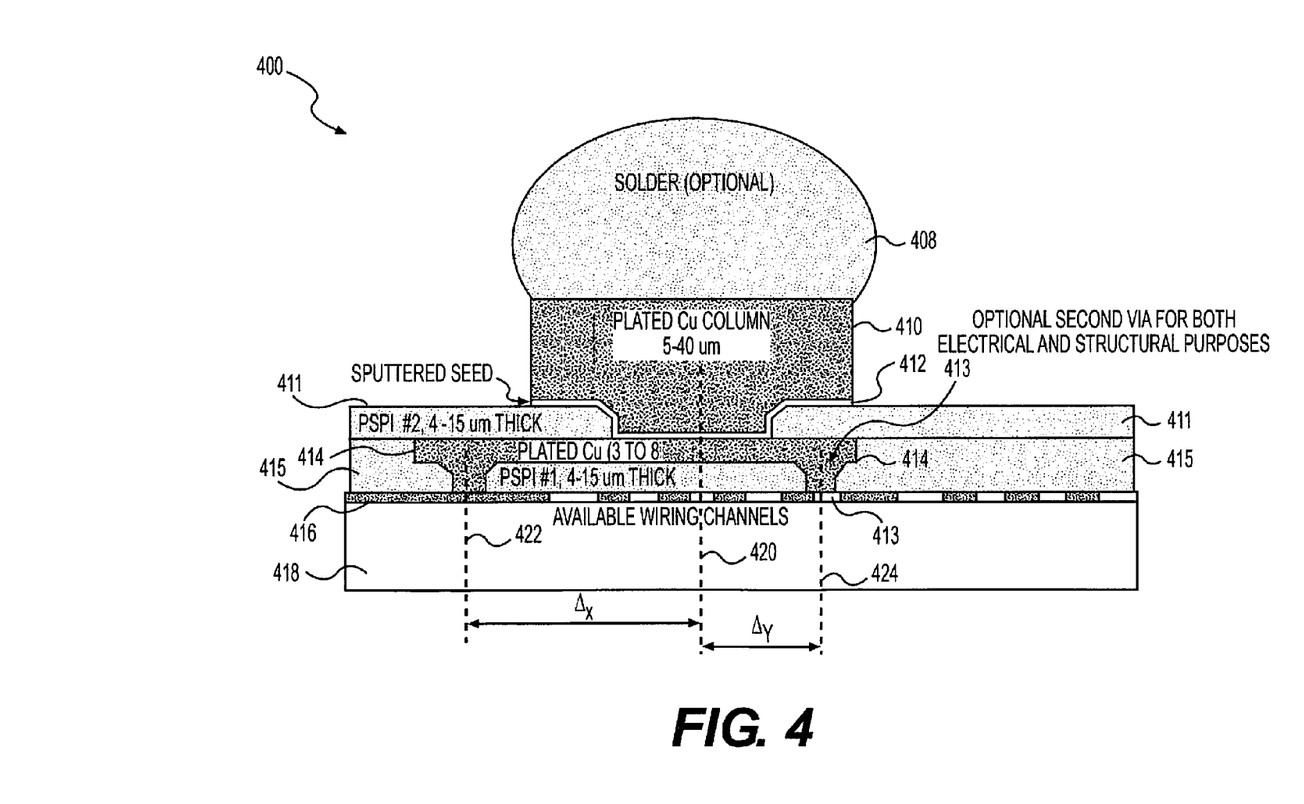
FIG. 4, comprising one embodiment of the invention, illustrates a side elevation in cross-section that depicts a structure similar to the structure of FIG. 2, however, using a plated copper column and optional solder, and where the plated copper interconnecting line extends through multiple via openings.
Figure 5:
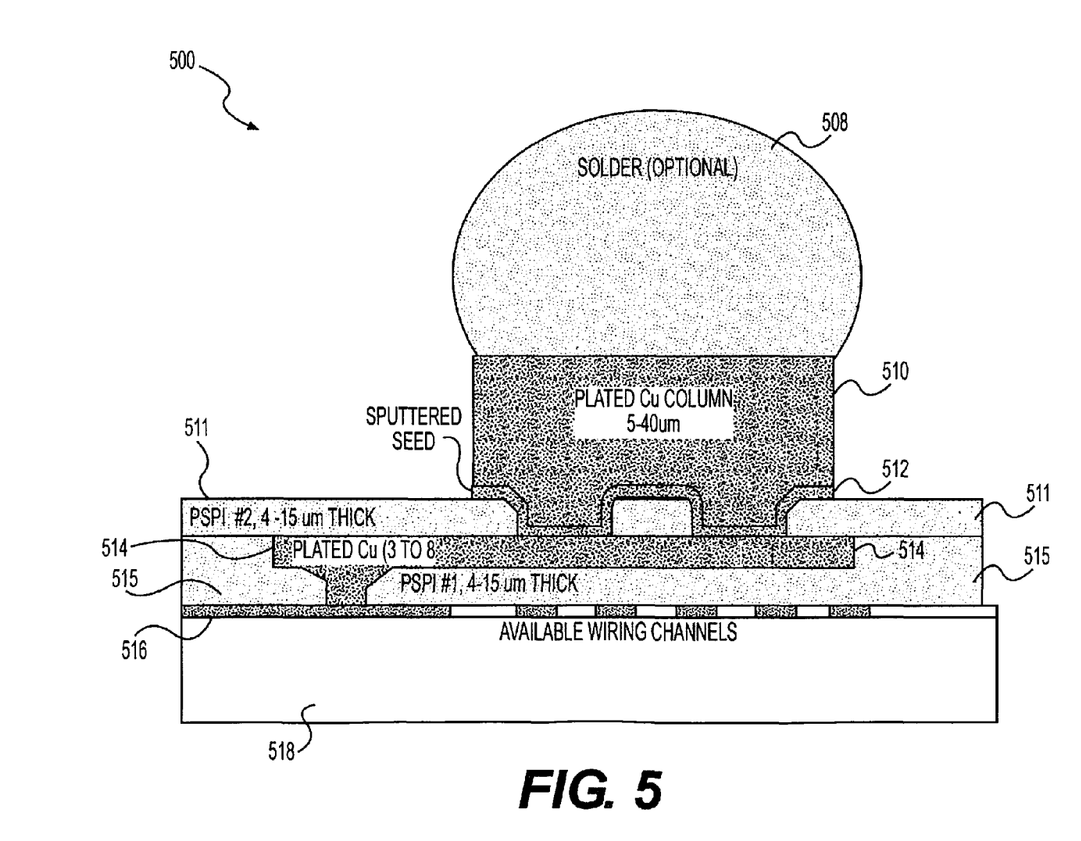
FIG. 5, comprising one embodiment of the invention, illustrates a side elevation in cross-section that depicts a structure similar to the structure of FIG. 4, and where the plated copper column extends through multiple via openings.

The same concept can be applied to Cu columns, represented in FIGS. 4 and 5, i.e., the decoupling of the first level package connection stresses from the BEOL structures. Note that there could be several vias connected to the Cu connection line in a different plane from what is shown in FIGS. 4 and 5. The Cu columns, with or without solder capping, can also have a large via, or multiple vias connecting to the Cu line.

Figure 6:
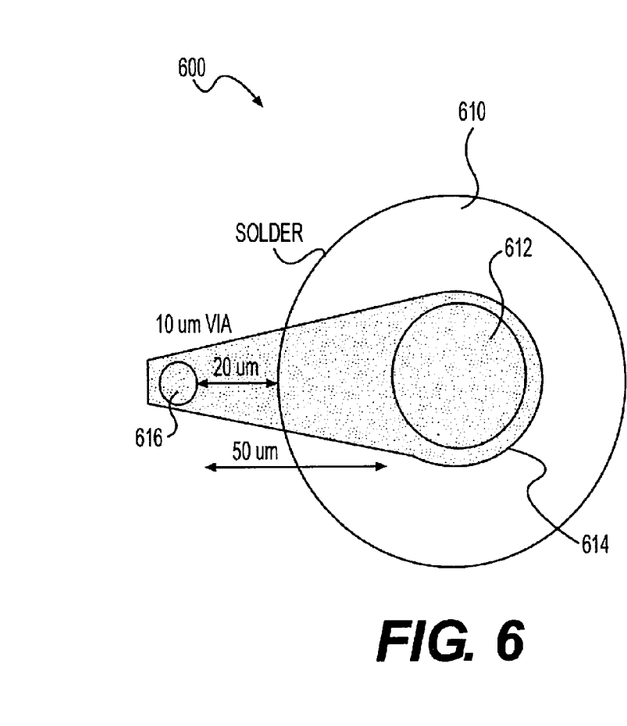
FIG. 6, comprising one embodiment of the invention, illustrates a plan view illustrating an enhanced connection from a FBEOL via opening to the solder position or solder ball as illustrated in FIG. 2.
Figure 7:
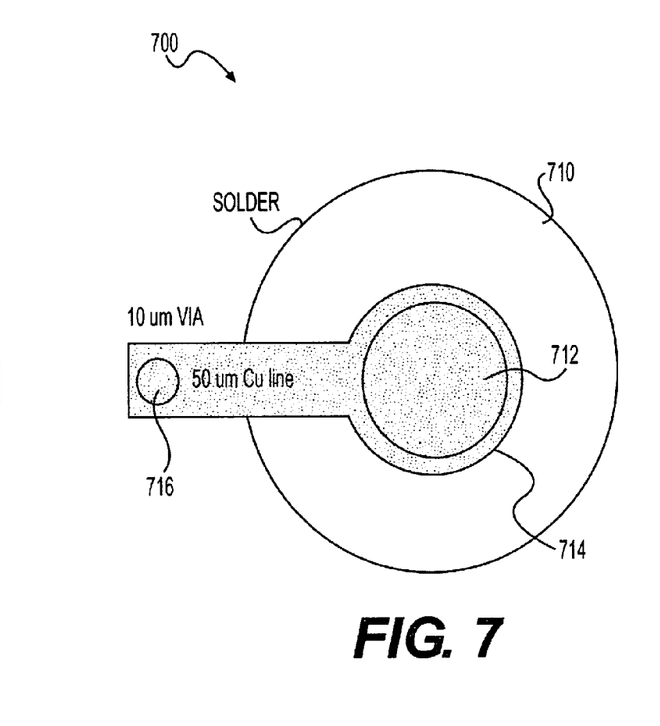
FIG. 7, comprising one embodiment of the invention, illustrates a plan view illustrating an enhanced connection from a FBEOL via opening to the solder position or solder ball as illustrated in FIG. 2.

FIG. 6 shows a connection from the FBEOL via to the solder position, and (not shown) the UBM PSPI via opening can be replaced by multiple smaller vias adding electrical redundancy. It should be noticed that the connecting length (between the PSPI#1 via edge and the PSPI #2 via edge in FIGS. 2 through 5) can be as long as the design can tolerate, but it should not exceed the minimum C4 pitch. Another attribute of this invention is the ability of connecting adjoining power (or ground) vias during the Cu line fabrication.

Introducing an extra polyimide cushion layer (PSPI #1 shown in FIG. 2 as element 211), and in addition removing the via from under the Pb-free solder bump, can reduce strain in FBEOL layers such as tetraethylorthosilicate ("TEOS") and fluorinated silicate glass ("FTEOS") fat-wiring layers, or in the ultra low k layers in the BEOL, and eliminate cracks in these layers after die attach to an organic package due to high-strain during cool-down arising from high-CTE mismatch between die and organic carrier. PSPI #1 can comprise a dual dielectric of a silicon oxide such as SiO2 and the art known equivalents thereof in combination with the organic dielectric such as PSPI, or alternatively, it could be 100% SiO2 or art-known inorganic equivalents and no PSPI. FEM modeling of the proposed structure comparing to the FIG. 1 structure was conducted. The high stress between Cu and under layering oxide is reduced by moving the via outside the C4. Both structures in FIGS. 2 and 3 reduce stress relative to FIG. 1.

Figure 2:
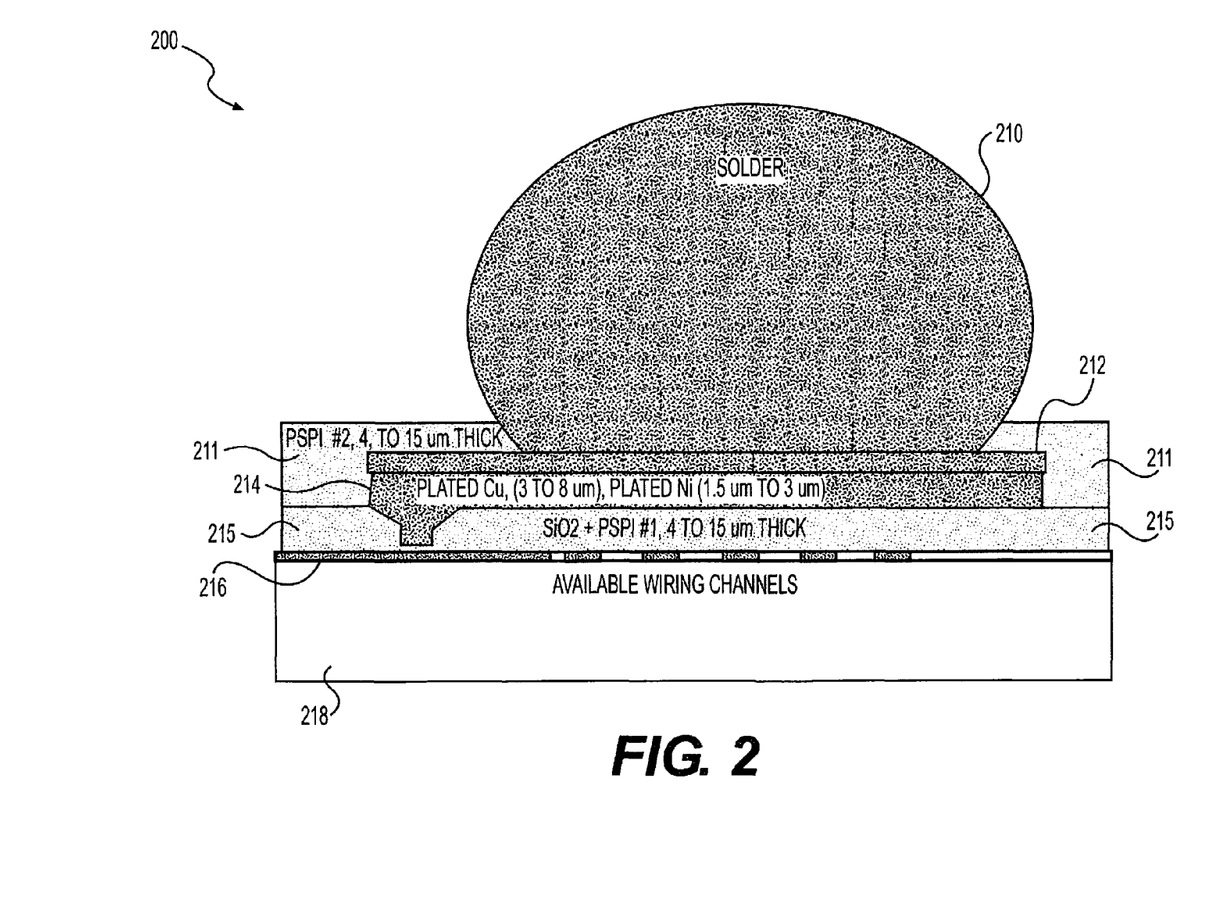
FIG. 2, comprising one embodiment of the invention, illustrates a side elevation in cross-section employing a two-level PSPI, for decoupling a BLM and ball drop solder connection to a FBEOL via opening.
Figure 3:
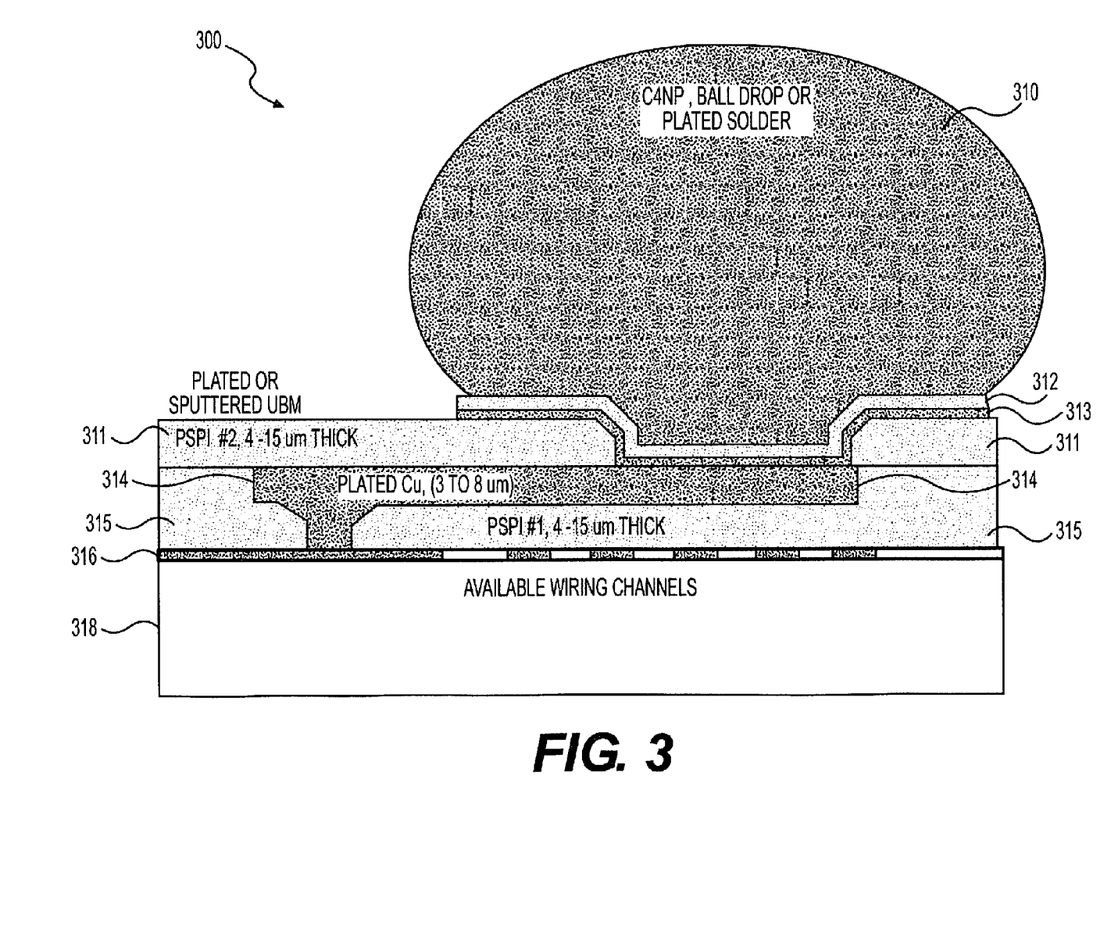
FIG. 3, comprising one embodiment of the invention, illustrates a side elevation in cross-section that depicts a structure similar to the structure of FIG. 2, but where the UBM element is sputtered or plated in the region of a via opening, and where the solder ball comprises a plated or a C4NP, ball drop solder ball, or plated solder.

FIG. 3 results in higher stress than FIG. 2 due to stress concentration from the UBM corner as illustrated in Table 1.

TABLE 1

| | Relative maximum stress in oxide under C4 (control = 1) |
|---|---|
| Control | 1 |
| Option 1 (no BLM) | 0.56 |
| Option 2 (with BLM) | 0.66 |

The importance of this invention, in one aspect comprises a device and process that successfully allows for a Pb-free solder system that meets EM and CPI requirements for server devices.

Figure 1:
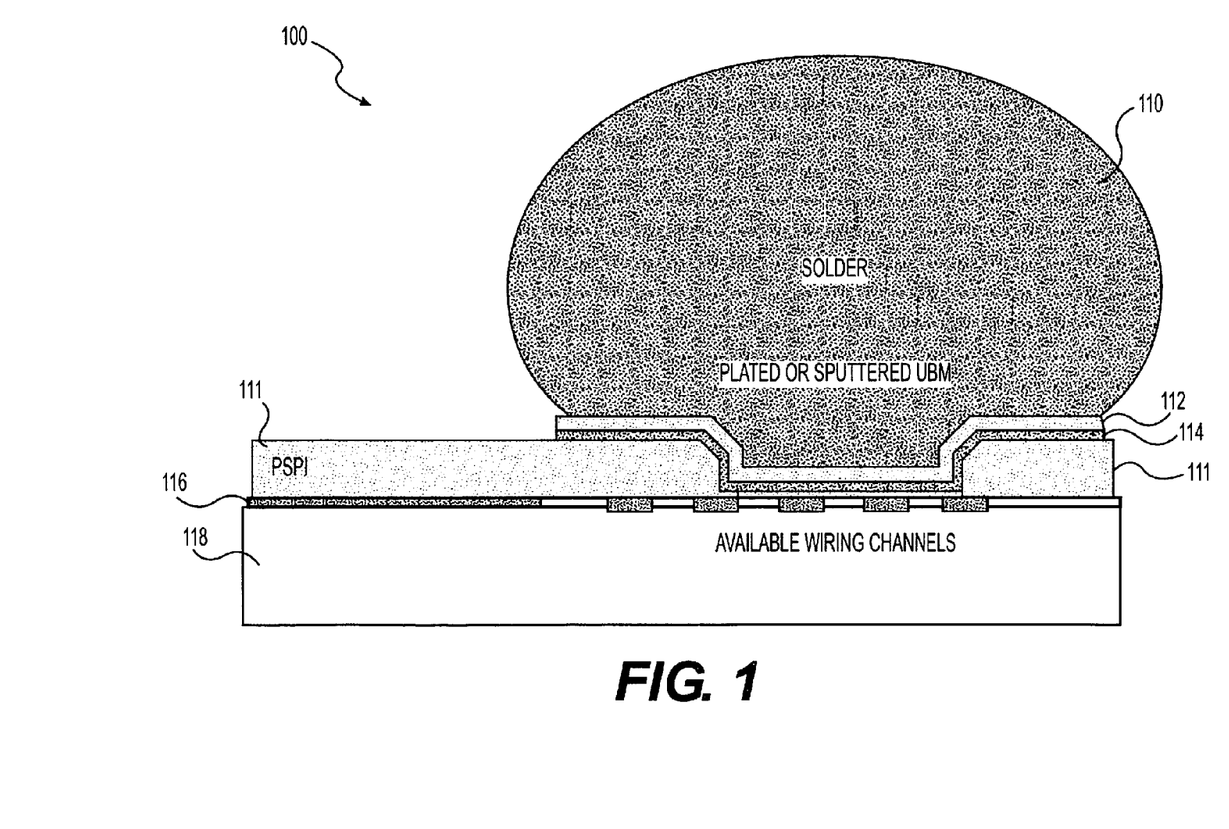
FIG. 1 comprises a side elevation in cross-section employing a single level PSPI, for decoupling a BLM and ball drop solder connection to a FBEOL via opening.

In the drawings, FIG. 1 comprises an illustration of a device as noted previously herein where structure 100 comprises a single solder connecting layer (which is part of an array) prior to joining to the substrate. Layer 112 comprises a plated Ni and optional Cu or Au layer under a solder bump 110 for improving wettability. Layer 114, plated Cu, comprises a wiring layer connecting the last BEOL layer 116, of the semiconductor structure 118, to solder bump 110.

FIG. 2 comprises an illustration of a device as noted previously herein where structure 200 comprises a single solder connecting layer (which is part of an array) prior to joining to the substrate. Layer 212 comprises a plated Ni and optional immersion Au layer under a solder bump 210 for improving wettability, PSPI dielectric layer 211 (PSPI #2), a photosensitive polyimide film with an opening in it under solder ball 210, layer 214 comprises plated Cu, a dielectric layer 215 (PSPI #1) comprising a photosensitive polyimide film with openings in it under layer 214, the last BEOL layer 216, a wiring layer connecting the last BEOL layer 216 of the semiconductor structure 218.

FIG. 3 comprises an illustration of a device as noted previously herein where structure 300 comprises a single solder connecting layer (which is part of an array) comprising layer 311, PSPI #2, a photosensitive polyimide film with an opening in it under solder ball 310, layer 312, a Ni UBM deposit on top of 311 with an optional Cu or Au layer under the solder bump 310 for improved wettability, PSPI#2, sputter seed layer 313 comprising a TiW adhesion layer, and an optional Cu layer when pattern electroplating is used for depositing Ni and solder, a wiring layer 314 comprising plated Cu, connecting the last BEOL layer 316 to solder bump 310, layer 315 (PSPI #1) comprising a photosensitive polyimide film with openings in it under layer 314, BEOL layer 316 comprising Cu vias and wiring in dielectric layer 315. Layer 318 comprises a semiconductor structure having available wiring channels operatively associated with layer 316.

FIG. 4 comprises an illustration of a device as noted previously herein where structure 400 comprises a connecting layer (which is part of an array), a 411, PSPI #2, a photosensitive polyimide film with an opening in it under optional solder ball 408, operatively associated with plated copper column 410 with an optional Ni and a top Cu capping layer for improved intermetallic resistance, layer 412, a sputter seed layer comprising both a TiW adhesion layer and a Cu layer for pattern electroplating copper column 410, connector 413 an optional second via for both enhanced electrical and enhanced structural effects, layer 414 comprising plated Cu, a wiring layer connecting the last BEOL layer 416 to plated copper column 410, layer 415, PSPI #1, comprising a photosensitive polyimide film with openings in it under layer 414, the last BEOL layer 416 of the semiconductor structure 418. Wiring layer 414 can also be used to connect adjacent power or ground pads, or to better distribute the current from the BEOL to the solder or the optional Cu column.

Axis 420 is the vertical axis for copper column 410 and/or solder ball 408, whereas vertical axis 422 is the vertical axis of a first connector extending from layer 414, and axis 424 is the vertical axis of a second connector extending from layer 414. The distance between the axes 422, 420 and 424 is represented by the lines $\Delta x$ and $\Delta y$ which can be anywhere from about 5 um to about 150 um; about 10 um to about 75 um; or about 20 um to about 50 um; or in one embodiment, greater than about one-half the width of the solder bump. These distances, or separation dimensions, or offsets apply to both $\Delta x$ and $\Delta y$ which may be the same or different, and also apply where only a single connection extends from layer 414 to layer 416, i.e., the article of manufacture of the invention has only one separation of the axes, either $\Delta x$ or $\Delta y$. These separation dimensions also apply where the article of manufacture of the invention has three, four, five or more connectors from layer 414 to layer 416 and also apply to the other Figures depicted in the drawings and the equivalents thereof.

Layers 214, 314, 414, and 514 comprises plated Cu, although any electrical conductor material, known in the art can be employed, and combinations thereof, especially a thick electrical conductor where these thicknesses can vary as set forth in this written description to include different thicknesses and different ranges of thicknesses. For example, these thicknesses in one embodiment of the invention comprise thicknesses of from about 2 um to about 10 um and more specifically between about 3 um to about 8 um.

In another embodiment of the invention, the plated nickel, illustrated in FIG. 2, where these thicknesses can vary as set forth in this written description to include different thicknesses and different ranges of thicknesses, and may also vary in thickness, e.g., from about 1 um to about 5 um, or more specifically between about 1.5 um and about 3 um and about 20 um to about 200 um.

FIG. 5 comprises an illustration of a device as noted previously herein where structure 500 comprises a connecting layer (which is part of an array) comprising layer 511, PSPI #2, a photosensitive polyimide film with an opening in it under optional solder ball 508, optional solder capping, with multiple connecting vias from the wiring layer 514 to the Cu column with an optional Ni and at top Cu capping layers for improved intermetallic resistance, or solder operatively associated with plated copper column 510, layer 512, a sputter seed layer comprising both a TiW adhesion layer and a Cu layer for pattern electroplating of the copper column 510, solder layer 512 positioned on top of layer 511, layer 515, PSPI#2 comprising a photosensitive polyimide film, layer 514 comprising plated Cu, a wiring layer connecting the last BEOL layer 516 to plated copper column 510, wiring layer 514 having multiple connecting vias to the Cu column 510 and/or or solder ball 508. Layer 515, PSPI #1, comprises a photosensitive polyimide film with openings in it under layer 514, BEOL layer 516 comprising Cu vias and wiring in dielectric layer 515. Layer 516 also connects to the rest of the semiconductor structure 518.

Layers 410, and 510 comprises thick plated Cu layer, although any electrical conductor material, known in the art can be employed, and combinations thereof, especially a thick electrical conductor where these thicknesses can vary as set forth in this written description to include different thicknesses and different ranges of thicknesses. For example, these thicknesses in one embodiment of the invention comprise thicknesses of from about 5 um to about 100 um, between about 5 um to about 10 um, or between about 40 and about 50 um.

The invention in another embodiment includes the combination of structures in FIGS. 2, 3, 4, and 5. That is, it comprises solder only instead of Cu columns in FIGS. 4 and 5, or a combination of the bridge structure in FIG. 4 with the multiple vias of FIG. 5 for either copper column, solders and copper, and the solder structure.

FIG. 6 comprises a plan view of a device as noted previously herein depicting the wiring layer connecting the BEOL structure to the UBM/solder, and includes via opening 612 in PSPI#2 connecting the wiring layer 614 to the UBM and solder. The wiring layer 614 of this invention expands for improved current distribution at the UBM/solder connection or to the Cu pillar or pedestal. The device further includes a copper filled via opening 616 in PSPI#1

The drawings illustrate PSPI #1 and PSPI #2 thicknesses, where these thicknesses can vary as set forth in this written description to include different thicknesses and different ranges of thicknesses. For example, these thicknesses in one embodiment of the invention comprise thicknesses of from about 5 um to about 20 um, or between about 4 um to about 15 um Thus the invention comprises a microcircuit article of manufacture comprising an electrical conductor for example conductors 210; 310, 312, 313; optional conductor 408, with conductor 410, 412, and optional conductor 508 with conductor 510, 512. The electrical conductor is electrically connected to both a first microcircuit element at a site comprising a first connector site having a first connector site axis and a second microcircuit element at a site comprising a second connector site having a second connector site axis, where the first microcircuit element comprises, for example element 212, 214; 314, 414; 514; with the first microcircuit element and the second microcircuit element being separated by and operatively associated with a layer comprising a first electrical insulator layer for example 215; 315; 415; 515, the electrical conductor and the first microcircuit element being separated by and operatively associated with a layer comprising a second electrical insulator layer, for example electrical insulator 211; 311; 411; 511, where the first connector site axis and the second connector site axis are not concentric, and wherein at least one of the first electrical insulator layer and the second electrical insulator layer comprise a polymeric electrical insulator layer.

The article of manufacture and the process of this invention therefore comprise structures with at one first polymeric insulator layer or a second polymeric insulator layer or both a first polymeric insulator layer and a second polymeric insulator layer. Although referred to as layers comprising a first polymeric insulator layer and a second polymeric insulator layer, these layers also comprise stacked multiple layers of polymeric insulator layers and can include other layers interspersed in the stack.

In one embodiment of the invention, both the first electrical insulator layer and the second electrical insulator layer each comprise a polymeric electrical insulator layer.

In other embodiments, the first connector site axis and the second connector site axis are sufficiently spaced from one another to reduce at least one of EM, or CPI, or current density, or connector stresses in the article. For example, the first connector site axis and the second connector site axis are sufficiently spaced from one another to reduce at least connector stresses in the article between the first microcircuit element and the second microcircuit element.

In further embodiments one of the connector sites is operatively associated with a conductor comprising a solder pad coated with solder, where the solder pad may include a layer comprising a UBM layer. Additionally, one of the connector sites may be operatively associated with a conductor comprising a copper column such as a copper column comprising a plated copper column, with optional solder on them. The connector sites may also comprise:

(a) a plurality of at least one of the sites comprising the first connector site and the second connector site;
(b) the first connector site and the second connector site comprise via openings in the insulator;
(c) the first connector site comprises a via or multiple vias opening in a BEOL site;
(d) the BEOL site comprises a last BEOL wiring level having a plurality of wiring channels;
(e) the via or vias opening in the first connector site is about 10 um in diameter;
(f) the via opening in the second connector site is about 40 um in diameter, or it consist of multiple smaller vias about 10 um in diameter;

Alternately, when the UBM is integrated in the wiring layer, the second connector opening can be as large as about 90 um.

(g) expanding wiring connecting the BEOL to the second connector site to facilitate better current dissipation from the 10 um via to the 40 um or 90 um pads.

The electrical conductor may comprise a planar pad about 90 um in diameter, and the first connector site and the second connector site may be positioned sufficiently away from the edge of the microcircuit to reduce stress relative to the POR structure.

The invention in a further embodiment comprises a process of making a microcircuit article of manufacture comprising in any order, electrically connecting an electrical conductor to both a first microcircuit element at a site comprising a first connector site having a first connector site axis and a second microcircuit element at a site comprising a second connector site having a second connector site axis, separating the first microcircuit element and the second microcircuit element by a layer comprising a first polymeric electrical insulator, separating the electrical conductor and the first microcircuit element by a layer comprising a second polymeric electrical insulator, and aligning the first connector site axis and the second connector site axis so they are not concentric. This process may also comprise the step or steps of sufficiently spacing the first connector site axis and the second connector site axis from one another to reduce at least one of EM, or CPI, or current density, or connector stresses in the article. The process may also embody any one, or combination, or all of the other parameters set out in this patent specification and drawings.

Thus, we have provided a microcircuit article of manufacture comprising an electrical conductor electrically connected to both a first microcircuit element at a site comprising a first connector site having a first connector site axis and a second microcircuit element at a site comprising a second connector site having a second connector site axis, the first microcircuit element and the second microcircuit element being separated by and operatively associated with a layer comprising a first electrical insulator. The electrical conductor and the first microcircuit element are separated by and operatively associated with a layer comprising a second electrical insulator, where the first connector site axis and the second connector site axis are not concentric and wherein at least one of the first electrical insulator and the second electrical insulator comprise a polymeric electrical insulator. Furthermore, the first connector site axis and the second connector site axis are sufficiently spaced from one another to reduce at least one of EM, or CPI, or current density, or connector stresses in the article.

In the article of manufacture described in paragraph [0046.1], the first connector site axis and the second connector site axis can be sufficiently spaced from one another to reduce at least connector stresses in the article between the first microcircuit element and the second microcircuit element; one of the connector sites may be operatively associated with a conductor comprising a solder pad coated with solder; the solder pad may includes a layer comprising a UBM layer; the connector sites may comprise a plurality of at least one of the sites comprising the first connector site and the second connector site; the first connector site and the second connector site may comprise via openings in the insulators; the first connector site may comprise a via opening in a BEOL site; the BEOL site may comprises a last BEOL wiring level having a plurality of wiring channels; the first insulator or the second insulator may comprise PSPI or a silicon oxide or combinations thereof; the solder may comprise at least one of a lead free solder or a solder containing lead; the first connector site and the second connector site may be positioned sufficiently away from the edge of the microcircuit to reduce stress relative to the POR structure; or both the first insulator and the second insulator may comprise a polymer insulator.

We have also provided a process of making a microcircuit article of manufacture comprising in any order, electrically connecting an electrical conductor to both a first microcircuit element at a site comprising a first connector site having a first connector site axis and a second microcircuit element at a site comprising a second connector site having a second connector site axis, separating the first microcircuit element and the second microcircuit element by a layer comprising a first electrical insulator, separating the conductor and the first microcircuit element by a layer comprising a second insulator, and aligning the first connector site axis and the second connector site axis so they are not concentric. In this process we sufficiently space the first connector site axis and the second connector site axis from one another to reduce at least one of EM, or CPI, or current density, or connector stresses in the article and include a structure wherein at least one of the first electrical insulator and the second electrical insulator comprise a polymeric electrical insulator.

In the process we describe in paragraph [0046.3] we can sufficiently space the first connector site axis and the second connector site axis from one another to reduce at least connector stresses in the article between the first microcircuit element and the second microcircuit element; or conduct the process in a way comprising operatively associating one of the connector sites with a conductor comprising a solder pad coated with solder; where the solder pad may include a layer comprising a UBM layer; the connector sites may comprise a plurality of at least one of the sites comprising the first connector site and the second connector site; the first connector site and the second connector site may comprise via openings in the insulators; the first connector site may comprise a via opening in a BEOL site; the BEOL site may comprise a last BEOL wiring level having a plurality of wiring channels; the first insulator or the second insulator may comprise PSPI or a silicon oxide or combinations thereof; the solder may comprise at least one of a lead free solder or a solder containing lead; we may position the first connector site and the second connector site sufficiently away from the edge of the microcircuit to reduce stress relative to the POR structure; both the first insulator; and the second insulator may comprise a polymer insulator.

Throughout this specification, abstract of the disclosure, and in the drawings the inventors have set out equivalents, including without limitation, equivalent elements, materials, compounds, compositions, conditions, processes, structures and the like, and even though set out individually, also include combinations of these equivalents such as the two component, three component, or four component combinations, or more as well as combinations of such equivalent elements, materials, compositions conditions, processes, structures and the like in any ratios or in any manner.

Additionally, the various numerical ranges describing the invention as set forth throughout the specification also includes any combination of the lower ends of the ranges with the higher ends of the ranges, and any single numerical value, or any single numerical value that will reduce the scope of the lower limits of the range or the scope of the higher limits of the range, and also includes ranges falling within any of these ranges.

The terms "about," "substantial," or "substantially" as applied to any claim or any parameters herein, such as a numerical value, including values used to describe numerical ranges, means slight variations in the parameter. In another embodiment, the terms "about," "substantial," or "substantially," when employed to define numerical parameter include, e.g., a variation up to five per-cent, ten per-cent, or 15 per-cent, or somewhat higher or lower than the upper limit of five per-cent, ten per-cent, or 15 per-cent. The term "up to" that defines numerical parameters means a lower limit comprising zero or a miniscule number, e.g., 0.001. The terms "about," "substantial" and "substantially" also mean that which is largely or for the most part or entirely specified. The inventors also employ the terms "substantial," "substantially," and "about" in the same way as a person with ordinary skill in the art would understand them or employ them. The phrase "at least" means one or a combination of the elements, materials, compounds, or conditions, and the like specified herein, where "combination" is defined above. The terms "written description," "specification," "claims," "drawings," and "abstract" as used herein refer to the written description, specification, claims, drawings, and abstract of the disclosure as originally filed, or the written description, specification, claims, drawings, and abstract of the disclosure as subsequently amended, as the case may be.

All scientific journal articles and other articles, including internet sites, as well as issued and pending patents that this written description mentions including the references cited in such scientific journal articles and other articles, including internet sites, and such patents, are incorporated herein by reference in their entirety and for the purpose cited in this written description and for all other disclosures contained in such scientific journal articles and other articles, including internet sites as well as patents and the aforesaid references cited therein, as all or any one may bear on or apply in whole or in part, not only to the foregoing written description, but also the following claims, abstract of the disclosure, and appended drawings.

Although the inventors have described their invention by reference to some embodiments, other embodiments defined by the doctrine of equivalents are intended to be included as falling within the broad scope and spirit of the foregoing written description, and the following claims, abstract of the disclosure, and appended drawings.

We claim:

1. A microcircuit article of manufacture comprising an electrical conductor electrically connected to both a first microcircuit element at a site comprising a first connector site having a first connector site axis and a second microcircuit element at a site comprising a second connector site having a second connector site axis, said first microcircuit element and said second microcircuit element being separated by and operatively associated with a layer comprising a first electrical insulator, said electrical conductor and said first microcircuit element being separated by and operatively associated with a layer comprising a second electrical insulator, where said first connector site axis and said second connector site axis are not concentric and wherein at least one of said first electrical insulator and said second electrical insulator comprise a polymeric electrical insulator, wherein said first connector site axis and said second connector site axis are sufficiently spaced from one another to reduce at least one of EM, or CPI, or current density, or connector stresses in said article.

2. The article of manufacture of claim 1 wherein said first connector site axis and said second connector site axis are sufficiently spaced from one another to reduce at least connector stresses in said article between said first microcircuit element and said second microcircuit element.

3. The article of manufacture of claim 1 wherein one of said connector sites is operatively associated with a conductor comprising a solder pad coated with solder.

4. The article of manufacture of claim 3 wherein said solder pad includes a layer comprising a UBM layer.

5. The article of manufacture of claim 1 wherein said connector sites comprise a plurality of at least one of said sites comprising said first connector site and said second connector site.

6. The article of manufacture of claim 1 wherein said first connector site and said second connector site comprise via openings in said insulators.

7. The article of manufacture of claim 1 wherein said first connector site comprises a via opening in a BEOL site.

8. The article of manufacture of claim 1 wherein said BEOL site comprises a last BEOL wiring level having a plurality of wiring channels.

9. The article of manufacture of claim 1 wherein said first insulator or said second insulator comprise PSPI or a silicon oxide or combinations thereof.

10. The article of manufacture of claim 3 wherein said solder comprises at least one of a lead free solder or a solder containing lead.

11. The article of manufacture of claim 1 wherein said first connector site and said second connector site are positioned sufficiently away from the edge of said microcircuit to reduce stress relative to the POR structure.

12. The article of manufacture of claim 1 wherein both said first insulator and said second insulator comprise a polymer insulator.

13. A process of making a microcircuit article of manufacture comprising in any order, electrically connecting an electrical conductor to both a first microcircuit element at a site comprising a first connector site having a first connector site axis and a second microcircuit element at a site comprising a second connector site having a second connector site axis, separating said first microcircuit element and said second microcircuit element by a layer comprising a first electrical insulator, separating said conductor and said first microcircuit element by a layer comprising a second insulator, aligning said first connector site axis and said second connector site axis so they are not concentric, sufficiently spacing said first connector site axis, and said second connector site axis from one another to reduce at least one of EM, or CPI, or current density, or connector stresses in said article and wherein at least one of said first electrical insulator and said second electrical insulator comprise a polymeric electrical insulator.

14. The process of claim 13 comprising sufficiently spacing said first connector site axis and said second connector site axis from one another to reduce at least connector stresses in said article between said first microcircuit element and said second microcircuit element.

15. The process of claim 13 comprising operatively associating one of said connector sites with a conductor comprising a solder pad coated with solder.

16. The process of claim 15 wherein said solder pad includes a layer comprising a UBM layer.

17. The process of claim 13 wherein said connector sites comprise a plurality of at least one of said sites comprising said first connector site and said second connector site.

18. The process of claim 13 wherein said first connector site and said second connector site comprise via openings in said insulators.

19. The process of claim 13 wherein said first connector site comprises a via opening in a BEOL site.

20. The process of claim 13 wherein said BEOL site comprises a last BEOL wiring level having a plurality of wiring channels.

21. The process of claim 13 wherein said first insulator or said second insulator comprise PSPI or a silicon oxide or combinations thereof.

22. The process of claim 15 wherein said solder comprises at least one of a lead free solder or a solder containing lead.

23. The process of claim 13 comprising positioning said first connector site and said second connector site sufficiently away from the edge of said microcircuit to reduce stress relative to the POR structure.

24. The process of claim 13 wherein both said first insulator and said second insulator comprise a polymer insulator.

* * * * *